(12) United States Patent
Kucharski

(10) Patent No.: US 8,289,067 B2
(45) Date of Patent: Oct. 16, 2012

(54) METHOD AND SYSTEM FOR BANDWIDTH ENHANCEMENT USING HYBRID INDUCTORS

(75) Inventor: Daniel Kucharski, Carlsbad, CA (US)

(73) Assignee: Luxtera Inc., Carlsbad, CA (US)

(*) Notice: Subject to any disclaimer, the term of this patent is extended or adjusted under 35 U.S.C. 154(b) by 114 days.

(21) Appl. No.: 12/880,908

(22) Filed: Sep. 13, 2010

(65) Prior Publication Data
US 2011/0063024 A1    Mar. 17, 2011

Related U.S. Application Data

(60) Provisional application No. 61/276,580, filed on Sep. 14, 2009.

(51) Int. Cl.
*H03K 17/687* (2006.01)
(52) U.S. Cl. ............... 327/427; 327/372; 327/359
(58) Field of Classification Search ........... 327/365–508
See application file for complete search history.

(56) References Cited

U.S. PATENT DOCUMENTS

| | | | | |
|---|---|---|---|---|
| 5,023,574 A | * | 6/1991 | Anklam et al. | 333/20 |
| 6,329,865 B1 | * | 12/2001 | Hageraats et al. | 327/372 |
| 6,332,661 B1 | * | 12/2001 | Yamaguchi | 327/108 |
| 2002/0028660 A1 | * | 3/2002 | Desclos | 455/73 |
| 2002/0030530 A1 | * | 3/2002 | Tsutsumi | 327/365 |
| 2006/0267665 A1 | * | 11/2006 | Kawamoto | 327/427 |
| 2008/0012610 A1 | * | 1/2008 | Aoki et al. | 327/109 |

* cited by examiner

*Primary Examiner* — Lincoln Donovan
*Assistant Examiner* — Brandon S Cole
(74) *Attorney, Agent, or Firm* — McAndrews, Held & Malloy

(57) ABSTRACT

A method and system for bandwidth enhancement using hybrid inductors are disclosed and may include providing an electrical impedance that increases with frequency via hybrid inductors comprising a transistor, a capacitor, an inductor, and a resistor. A first terminal of the hybrid inductors may comprise a first terminal of the transistor. A second terminal of the transistor may be coupled to a first terminal of the resistor and a first terminal of the capacitor. A second terminal of the resistor may comprise a second terminal of the hybrid inductors. A third terminal of the transistor may be coupled to a first terminal of an inductor, and a second terminal of the inductor may be coupled to a second terminal of the capacitor. The hybrid inductors may be configured by varying transconductance, resistance, and/or capacitance and may be utilized as an amplifier load.

62 Claims, 6 Drawing Sheets

METHOD AND SYSTEM FOR BANDWIDTH ENHANCEMENT USING HYBRID INDUCTORS

CROSS-REFERENCE TO RELATED APPLICATIONS/INCORPORATION BY REFERENCE

This application makes reference to and claims priority to U.S. Provisional Application Ser. No. 61/276,580 filed on Sep. 14, 2009, which is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to signal processing. More specifically, certain embodiments of the invention relate to a method and system for bandwidth enhancement using hybrid inductors.

BACKGROUND OF THE INVENTION

As data networks scale to meet ever-increasing bandwidth requirements, the shortcomings of copper data channels are becoming apparent. Signal attenuation and crosstalk due to radiated electromagnetic energy are the main impediments encountered by designers of such systems. They can be mitigated to some extent with equalization, coding, and shielding, but these techniques require considerable power, complexity, and cable bulk penalties while offering only modest improvements in reach and very limited scalability. Free of such channel limitations, optical communication has been recognized as the successor to copper links.

Optical communication systems have been widely adopted for applications ranging from internet backbone, local area networks, data centers, supercomputing, to high-definition video. Due to superior bandwidth and low loss, optical fibers are the medium of choice for transporting high-speed binary data.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for bandwidth enhancement using hybrid inductors, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for bandwidth enhancement using hybrid inductors. Exemplary aspects of the invention may comprise providing an electrical impedance that increases with frequency utilizing one or more hybrid inductors that may comprise a transistor, a capacitor, an inductor, and a resistor. A first terminal of the one or more hybrid inductors may comprise a first terminal of the transistor. A second terminal of the transistor may be coupled to a first terminal of the resistor and a first terminal of the capacitor. A second terminal of the resistor may comprise a second terminal of the one or more hybrid inductors. A third terminal of the transistor may be coupled to a first terminal of an inductor, and a second terminal of the inductor may be coupled to a second terminal of the capacitor and comprises a third terminal of the one or more hybrid inductors. An impedance of the one or more hybrid inductors may be configured by varying a transconductance of the transistor, a resistance of the resistor, and/or a capacitance of the capacitor. A constant voltage may be applied to the second terminal of the one or more hybrid inductors. The transistor may be biased during large signal operation by supplying current to the third terminal of the transistor utilizing a current source. Signals may be amplified utilizing the one or more hybrid inductors as a load of one or more amplifiers, which may comprise differential amplifiers. The transistor may comprise a MOSFET and the inductor may comprise a passive inductor.

Figure 1A:
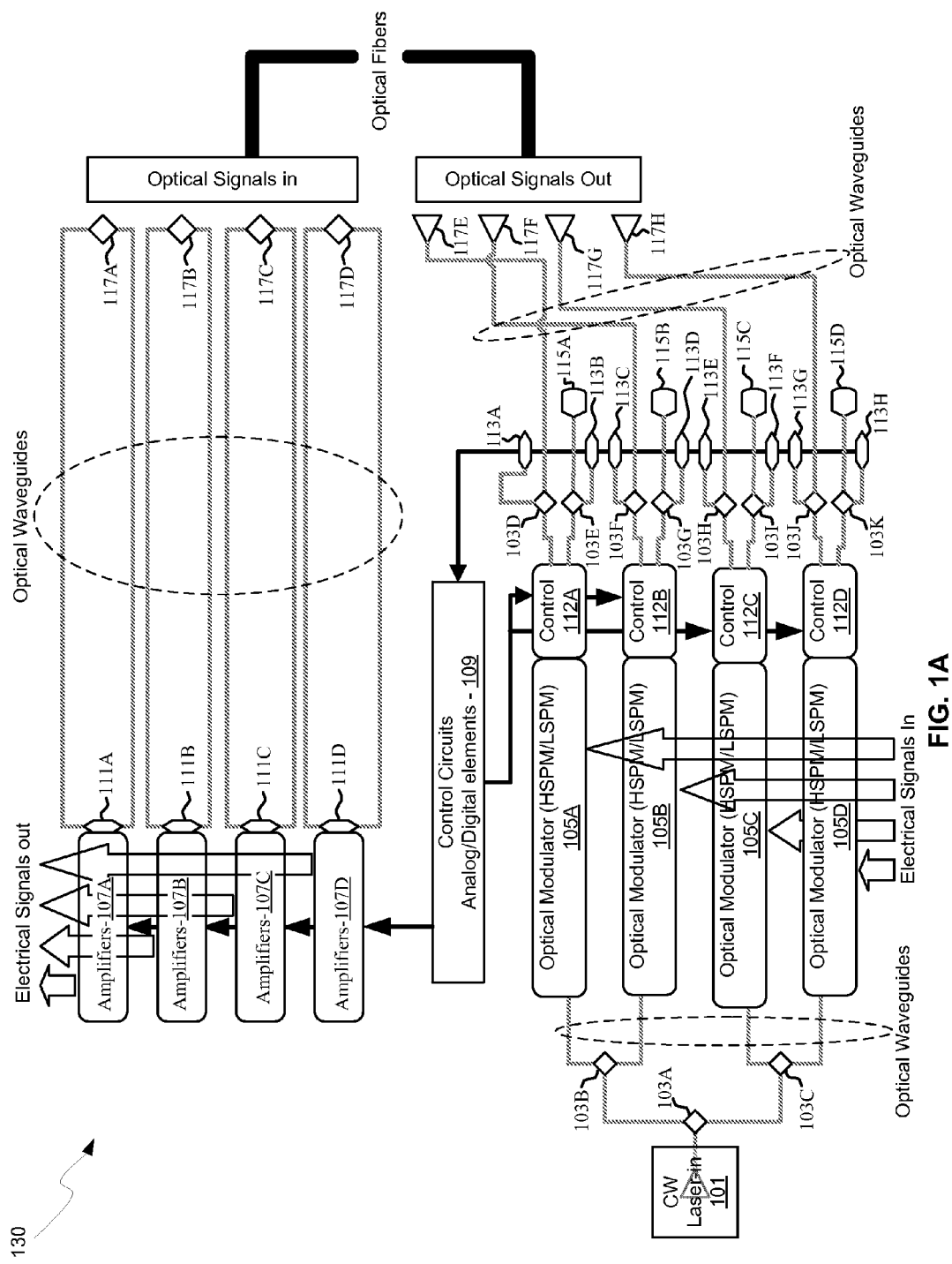
FIG. 1A is a block diagram of a photonically enabled CMOS chip comprising hybrid inductors, in accordance with an embodiment of the invention.

FIG. 1A is a block diagram of a photonically enabled CMOS chip comprising hybrid inductors, in accordance with an embodiment of the invention. Referring to FIG. 1A, there is shown optoelectronic devices on a CMOS chip 130 comprising optical modulators 105A-105D, phototransistors 111A-111D, monitor photodiodes 113A-113H, and optical devices comprising taps 103A-103K, optical terminations 115A-115D, and grating couplers 117A-117H. There are also shown electrical devices and circuits comprising amplifiers 107A-107D, analog and digital control circuits 109, and control sections 112A-112D. The amplifiers 107A-107D may comprise transimpedance and limiting amplifiers (TIA/LAs), for example. Optical signals are communicated between optical and optoelectronic devices via optical waveguides fabricated in the CMOS chip 130.

The optical modulators 105A-105D comprise Mach-Zehnder or ring modulators, for example, and enable the modulation of the CW laser input signal. The optical modulators 105A-105D comprise high-speed and low-speed phase modulation sections and are controlled by the control sections 112A-112D. The high-speed phase modulation section of the optical modulators 105A-105D may modulate a CW light source signal with a data signal. The low-speed phase modulation section of the optical modulators 105A-105D may compensate for slowly varying phase factors such as those induced by mismatch between the waveguides, waveguide temperature, or waveguide stress and is referred to as the passive phase, or the passive biasing of the MZI.

The phase modulators may have a dual role: to compensate for the passive biasing of the MZI and to apply the additional phase modulation used to modulate the light intensity at the output port of the MZI according to a data stream. The former phase tuning and the latter phase modulation may be applied by separate, specialized devices, since the former is a low speed, slowly varying contribution, while the latter is typically a high speed signal. These devices are then respectively referred to as the LSPM and the HSPM. Examples for LSPM are thermal phase modulators (TPM), where a waveguide portion is locally heated up to modify the index of refraction of its constituting materials, or forward biased PIN junctions (PINPM) where current injection into the PIN junction modifies the carrier density, and thus the index of refraction of the semiconductor material. An example of an HSPM is a reversed biased PIN junction, where the index of refraction is also modulated via the carrier density, but which allows much faster operation, albeit at a lower phase modulation efficiency per waveguide length.

The outputs of the modulators may be optically coupled via waveguides to the grating couplers 117E-117H. The taps 103D-103K comprise four-port optical couplers, for example, and are utilized to sample the optical signals generated by the optical modulators 105A-105D, with the sampled signals being measured by the monitor photodiodes 113A-113H. The unused branches of the taps 103D-103K are terminated by optical terminations 115A-115D to avoid back reflections of unwanted signals.

The grating couplers 117A-117H comprise optical gratings that enable coupling of light into and out of the CMOS chip 130. The grating couplers 117A-117D are utilized to couple light received from optical fibers into the CMOS chip 130, and the grating couplers 117E-117H are utilized to couple light from the CMOS chip 130 into optical fibers. The grating couplers 117A-117H may comprise single polarization grating couplers (SPGC) and/or polarization splitting grating couplers (PSGC). In instances where a PSGC is utilized, two input, or output, waveguides may be utilized.

The optical fibers may be epoxied, for example, to the CMOS chip, and may be aligned at an angle from normal to the surface of the CMOS chip 130 to optimize coupling efficiency. In an embodiment of the invention, the optical fibers may comprise single-mode fiber (SMF) and/or polarization-maintaining fiber (PMF).

In another exemplary embodiment, optical signals may be communicated directly into the surface of the CMOS chip 130 without optical fibers by directing a light source on an optical coupling device in the chip, such as the light source interface 135 and/or the optical fiber interface 139. This may be accomplished with directed laser sources and/or optical sources on another chip flip-chip bonded to the CMOS chip 130.

The phototransistors 111A-111 D may convert optical signals received from the grating couplers 117A-117D into electrical signals that are communicated to the amplifiers 107A-107D for processing. The phototransistors 111A-111D may comprise high-speed heterojunction phototransistors, for example, and may comprise germanium (Ge) in the collector and base regions for absorption in the 1.55 μm optical wavelength range, and may be integrated on a CMOS silicon-on-insulator (SOI) wafer.

The analog and digital control circuits 109 may control gain levels or other parameters in the operation of the amplifiers 107A-107D, which then communicate electrical signals off the CMOS chip 130. The control sections 112A-112D comprise electronic circuitry that enable modulation of the CW laser signal received from the splitters 103A-103C. The optical modulators 105A-105D require high-speed electrical signals to modulate the refractive index in respective branches of a Mach-Zehnder interferometer (MZI), for example. In an embodiment of the invention, the control sections 112A-112D may include sink and/or source driver electronics that may enable a bidirectional link utilizing a single laser.

Data links, regardless of whether they are electrical or optical, require high-speed, wide-bandwidth circuits with relatively high gain to equalize and amplify attenuated signals degraded by a variety of loss and dispersion mechanisms present in the communication channels. Power consumption may also be an important consideration in the design of such systems, but simultaneously achieving high bandwidth and gain usually happens at the expense of higher power. Bandwidth enhancement techniques may be used to circumvent this power tradeoff. A variety of conventional bandwidth enhancement techniques may be utilized. For example, inductive shunt peaking may be used to enhance amplifier bandwidth by increasing the impedance of the load as frequency of operation increases, effectively creating a zero in frequency response to cancel an amplifier's dominant pole. Shunt peaking may be accomplished using either passive inductors comprising spirals or coils of conductive material—typically a metal. Alternatively, active inductors may be used, comprising transistors, resistors, and capacitors. In an exemplary embodiment of the invention, bandwidth may be enhanced based on a hybrid inductor comprising both passive and active elements configured in a way that substantially enhances effective inductance through the interaction of these elements.

In an exemplary embodiment of the invention, an NMOS transistor, a resistor, a capacitor, and a passive inductor may be configured such that one terminal of the resistor is connected to the gate of the NMOS transistor while the other terminal of the resistor is connected to a substantially constant bias voltage. Further, the drain terminal of the NMOS transistor may be connected to another constant voltage, such as a power supply rail, while the source terminal of the NMOS transistor may be connected to the first terminal of the passive inductor, and the second terminal of said inductor may be connected to the gate terminal of the NMOS transistor via the capacitor. In this configuration, impedance observed between the second terminal of the passive inductor and the power supply rail increases with frequency of operation, producing effective inductance substantially larger than the passive inductor's value.

Other exemplary embodiments comprise different types of transistors, such as PMOS or BJT, and a variety of single-ended and differential configurations. Other enhancements may comprise tunable effective inductance or amplifier bandwidth accomplished by discrete or continuous variation of key parameters of the constituent hybrid inductor circuit elements, such as variable resistance, variable capacitance, variable inductance, and variable transistor transconductance. Other embodiments comprise low-pass filtering on the constant voltage connected to transistor gates through the resistor to improve power supply rejection, which may comprise a first-order RC network, or a multi-pole passive or active filter, for example.

In operation, the CMOS chip 130 may be operable to transmit and/or receive and process optical signals. The grating couplers 117A-117D may be operable to receive optical signals from optical fibers coupled to the chip 130 and may convert the optical mode of the fiber into the much smaller mode of a Si waveguide fabricated on the CMOS SOI wafer. The grating couplers 117A-117D may comprise a single-polarization or a polarization-splitting type: in the first case, only a specific polarization is coupled to a single Si waveguide, while in the second case, two orthogonal polarizations are split into two output waveguides.

In an exemplary embodiment of the invention, a broadband amplifier in the amplifiers 107A-107D may comprise hybrid inductor circuits that may be utilized as loads at drain terminals of a differential transistor pair and placed in series with load resistors. This configuration may convert current steered in response to gate voltage modulation into amplified voltage signals at the drain terminals of the differential transistor pair. The amplifiers 107A-107D may amplify signals generated by the photodetectors 111A-111D.

Figure 1B:
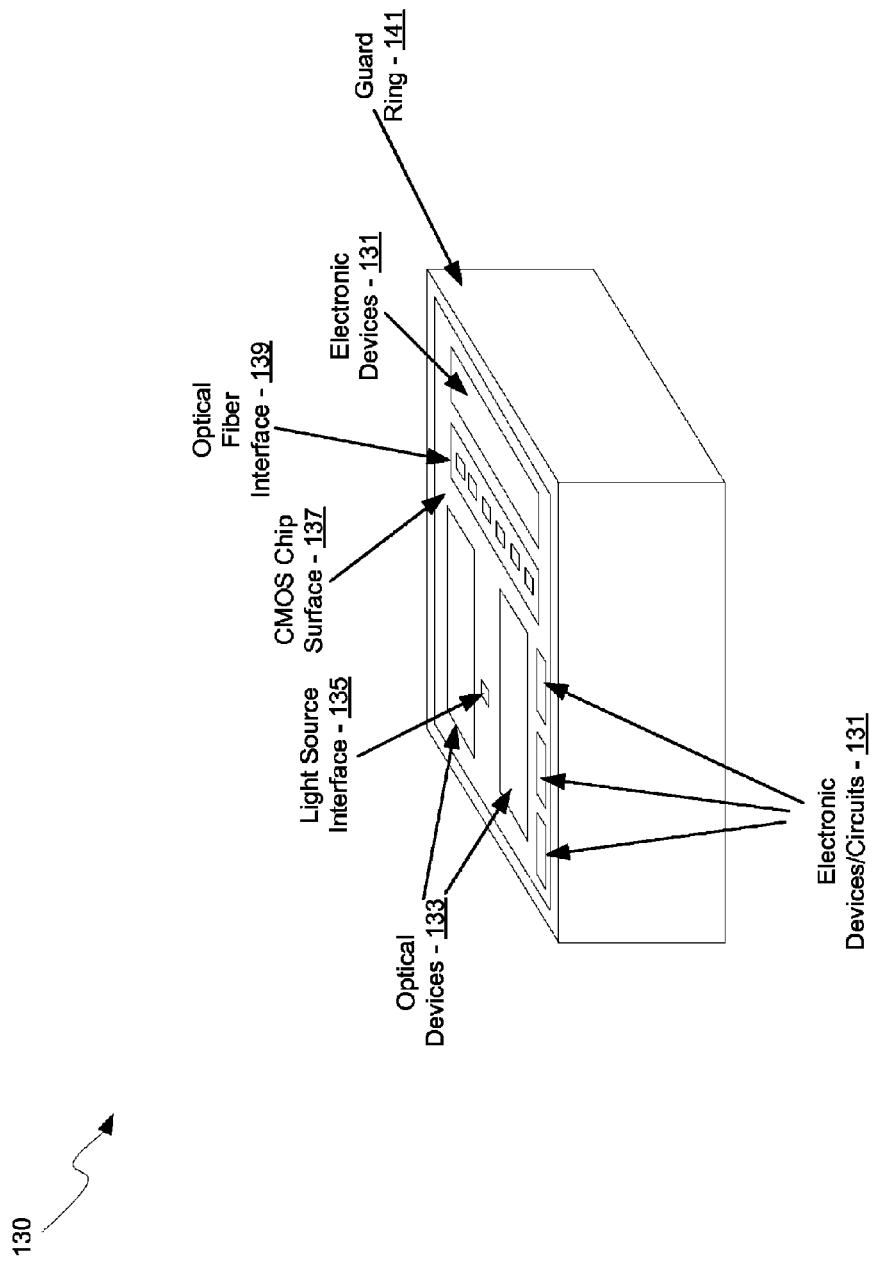
FIG. 1B is a diagram illustrating an exemplary CMOS chip, in accordance with an embodiment of the invention.

FIG. 1B is a diagram illustrating an exemplary CMOS chip, in accordance with an embodiment of the invention. Referring to FIG. 1B, there is shown the CMOS chip 130 comprising electronic devices/circuits 131, optical and optoelectronic devices 133, a light source interface 135, CMOS chip front surface 137, an optical fiber interface 139, and CMOS guard ring 141.

The light source interface 135 and the optical fiber interface 139 comprise grating couplers, for example, that enable coupling of light signals via the CMOS chip surface 137, as opposed to the edges of the chip as with conventional edge-emitting devices. Coupling light signals via the CMOS chip surface 137 enables the use of the CMOS guard ring 141 which protects the chip mechanically and prevents the entry of contaminants via the chip edge.

The electronic devices/circuits 131 comprise circuitry such as the amplifiers 107A-107D and the analog and digital control circuits 109 described with respect to FIG. 1A, for example. The optical and optoelectronic devices 133 comprise devices such as the taps 103A-103K, optical terminations 115A-115D, grating couplers 117A-117H, optical modulators 105A-105D, high-speed heterojunction phototransistors 111A-111D, and monitor photodiodes 113A-113H.

In an embodiment of the invention, components in the chip 130 may be configured to provide electrical impedance substantially increasing with frequency of operation, equivalent to inductance, where the inductance is able to exceed values achievable using conventional circuit configurations using subsets of the components.

Figure 1C:
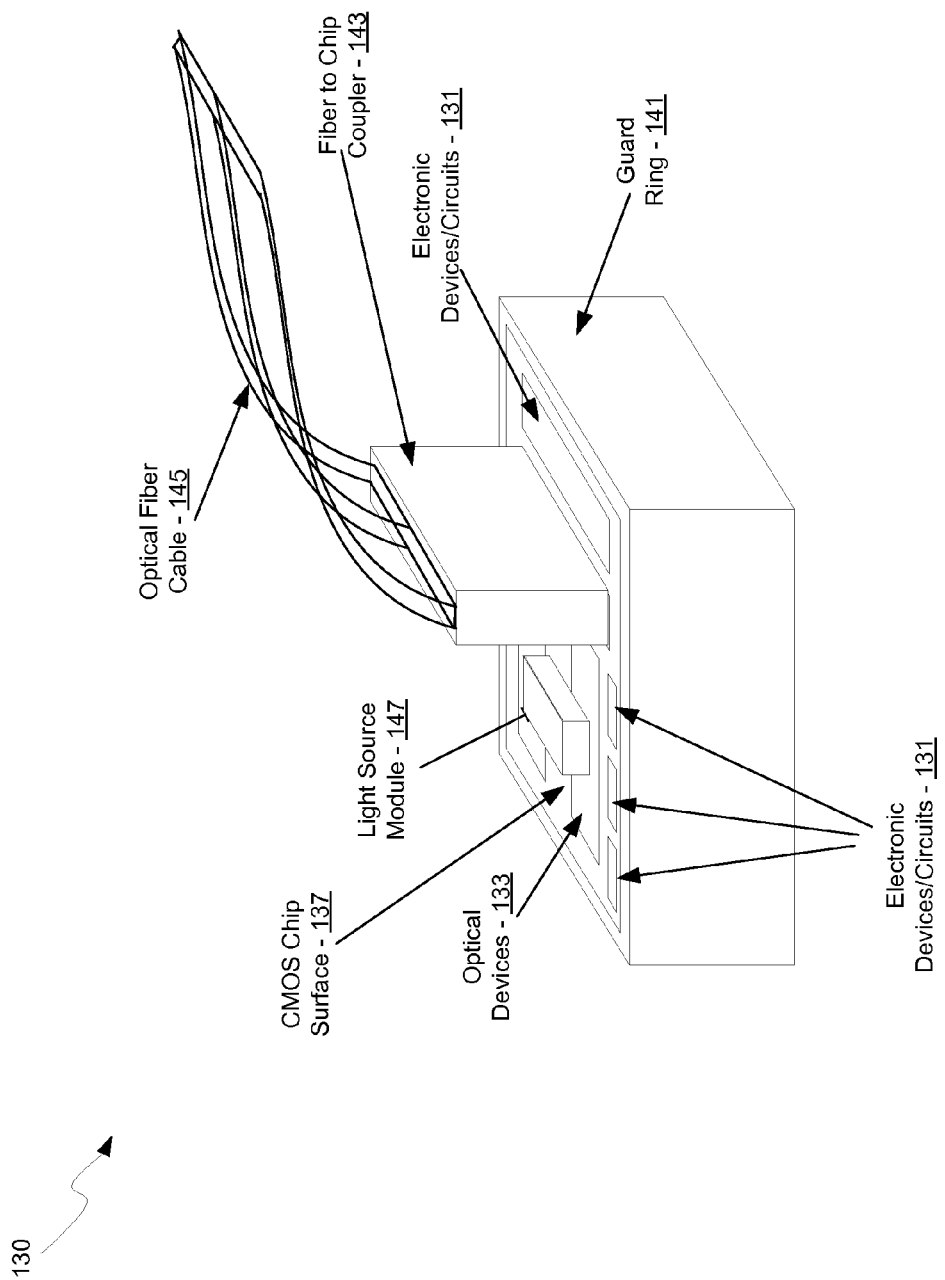
FIG. 1C is a diagram illustrating an exemplary CMOS chip coupled to an optical fiber cable, in accordance with an embodiment of the invention.

FIG. 1C is a diagram illustrating an exemplary CMOS chip coupled to an optical fiber cable, in accordance with an embodiment of the invention. Referring to FIG. 1C, there is shown the CMOS chip 130 comprising the CMOS chip surface 137, and the CMOS guard ring 141. There is also shown a fiber-to-chip coupler 143, an optical fiber cable 145, and an optical source assembly 147.

The CMOS chip 130 comprising the electronic devices/circuits 131, the optical and optoelectronic devices 133, the light source interface 135, the CMOS chip surface 137, and the CMOS guard ring 141 may be as described with respect to FIG. 1B.

In an embodiment of the invention, the optical fiber cable may be affixed, via epoxy for example, to the CMOS chip surface 137. The fiber-to-chip coupler 143 enables the physical coupling of the optical fiber cable 145 to the CMOS chip 130.

In an embodiment of the invention, components in the chip 130 may be configured to provide electrical impedance substantially increasing with frequency of operation, equivalent to inductance, where the inductance is able to exceed values achievable using conventional circuit configurations using subsets of the components.

Figure 1D:
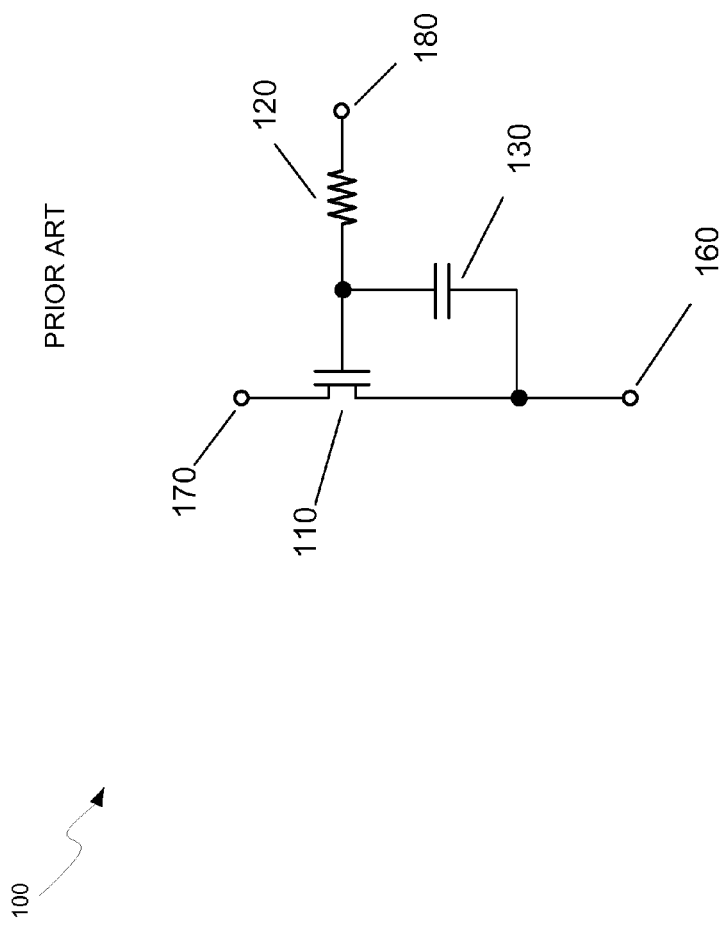
FIG. 1D is a block diagram of a single-ended active inductor circuit, in connection with an embodiment of the invention.

FIG. 1D is a block diagram of a single-ended active inductor circuit, in connection with an embodiment of the invention. Referring to FIG. 1, there is shown an active inductor 100 comprising a transistor 110, a resistor 120, and a capacitor 130. The active inductor comprises a three-terminal circuit where the main current flow path is from the drain terminal 170 to the source terminal 160, and the transistor gate bias may be supplied via terminal 180. This circuit demonstrates inductive characteristics, where the impedance between nodes 160 and 170 increases with applied frequency. This behavior is due to high-frequency energy transferred from terminal 160 to the gate of the transistor 110 via the capacitor 130.

Figure 2:
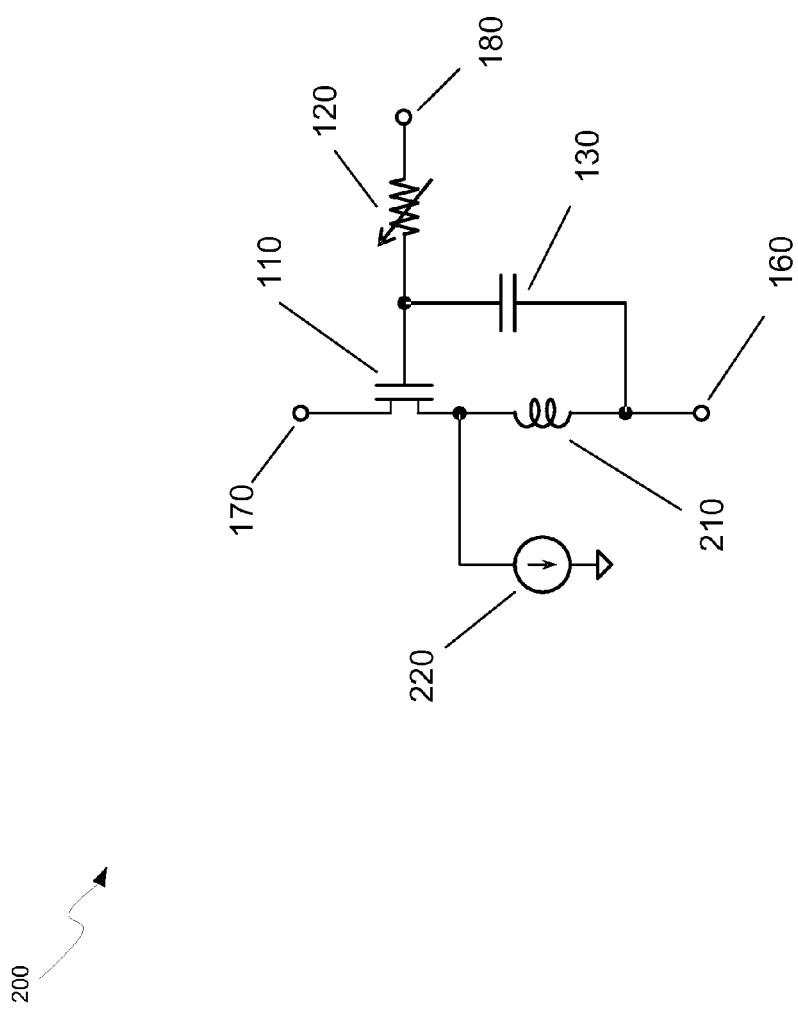
FIG. 2 is a block diagram of a single-ended embodiment of the hybrid inductor circuit, in accordance with an embodiment of the invention.

FIG. 2 is a block diagram of a single-ended embodiment of the hybrid inductor circuit, in accordance with an embodiment of the invention. Referring to FIG. 2, there is shown a hybrid inductor 200 comprising a transistor 110, a variable resistor 120, a capacitor 130, an inductor 210, and a current source 220.

The passive inductor 210 may be coupled between terminal 160 and the source terminal of the transistor 110. The transistor 110 may comprise a MOSFET, for example. The effective inductance of this circuit may be substantially enhanced by the inductor 210, as it may boost the high frequency content of the signal at node 160. The boosted high frequency content of the signal may then be transferred to the gate of the transistors via the capacitor 130, augmenting the active inductance of the transistor. The inductor 210 may be a compact multi-layer spiral inductor monolithically integrated with other circuit elements. This hybrid approach may circumvent the low self-resonance frequency of compact spiral inductors and parasitic capacitance limitations of active inductors, and may provide more inductance and more amplifier bandwidth enhancement than either of these techniques in a very small area.

In operation, the variable resistor 120 may provide control over the effective inductance of the circuit 200, and may be adjusted, either continuously or discretely, via a switch bank. Similar adjustments may also be made by configuring the impedance of the capacitor 130 or the inductor 210, or the transconductance and bias of the transistor 110. Finally, the constant current source 220 may be connected to the source of the transistor to prevent it from entering the cutoff region during large signal operation, which may improve linearity and jitter.

Figure 3:
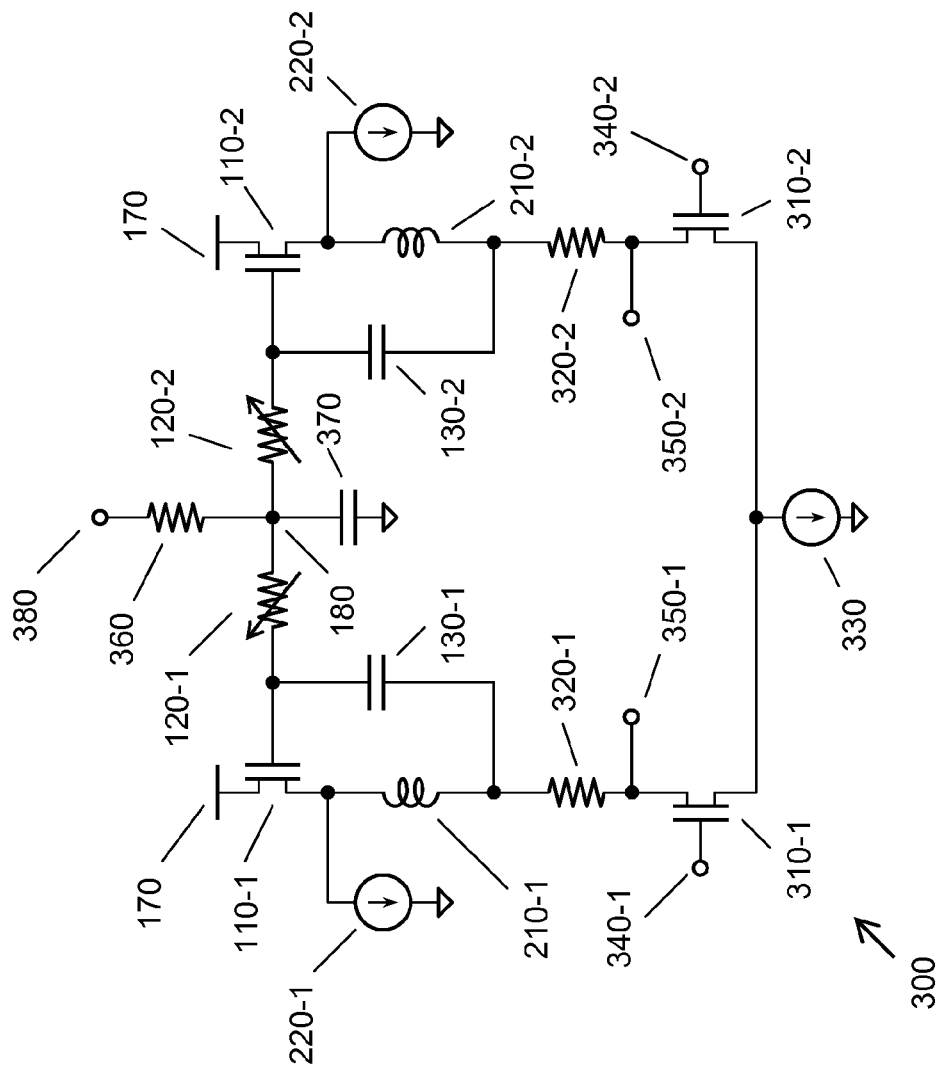
FIG. 3 is a block diagram of a differential amplifier utilizing hybrid inductors, in accordance with an embodiment of the invention.

FIG. 3 is a block diagram of a differential amplifier utilizing hybrid inductors, in accordance with an embodiment of the invention. Referring to FIG. 3, there is shown a differential amplifier 300 utilizing two hybrid inductor circuits to achieve bandwidth enhancement and comprising a constant tail current source 330, transistors 110-1, 110-2, 310-1, and 310-2, current sources 220-1 and 220-2, capacitors 130-1, 130-2, and 370, variable resistors 120-1 and 120-2, inductors 210-1 and 210-2, a resistor 360, and a pair of resistive loads 320-1 and 320-2.

In operation, the transistors 310-1 and 310-2 may steer current 330 in response to gate modulation voltages applied to the differential amplifier inputs 340-1 and 340-2, and the resistive loads 320-1 and 320-2 may convert the steered transistor current to voltage at the amplifier output terminals 350-1 and 350-2. The resistors 320-1 and 320-2 may determine the mid-band gain of the amplifier, and the hybrid inductors comprising the transistors 110-1 and 110-2, the inductors 210-1 and 210-2, the capacitors 130-1 and 130-2, and the variable resistors 120-1 and 120-2 may extend this gain into higher frequencies by counteracting dominant pole roll-off with increasing impedance at higher frequencies. This enhancement may save power by enabling the use of large resistances for the load resistors 320-1 and 320-2, which may translate to high gain and large maximum voltage swing with a relatively low value of current in the current source 330.

Since the amount of bandwidth enhancement may be adjustable via the variable resistors 120-1 and 120-2, and the elements of the differential amplifier 300 may be sized to peak the high-frequency gain above its mid-band value, the differential amplifier 300 may be used as an equalizer, which may be utilized to correct communication link impairments such as limited channel bandwidth, fabrication process variations, and other issues. Supply rejection of the amplifier may be improved by addition of a low-pass filter to clean up voltage at node 180, which may provide gate bias to the transistors 110-1 and 110-2 through the resistors 120-1 and 120-2. The simplest implementation of such a low-pass filter is an RC network comprising the resistor 360 and capacitor 370, but other implementations may be utilized. Improved supply rejection benefits performance of high-sensitivity signal amplifiers used in optical receivers, and may enable monolithic integration of 1-D and 2-D receiver arrays by suppressing channel-to-channel crosstalk without the use of dedicated voltage regulators for each channel.

In an embodiment of the invention, a method and system are disclosed for providing an electrical impedance that increases with frequency utilizing one or more hybrid inductors 200 that comprise a transistor 110, a capacitor 130, an inductor 210, and a resistor 120. A first terminal of the one or more hybrid inductors 200 may comprise a first terminal 170 of the transistor 110. A second terminal of the transistor 110 may be coupled to a first terminal of the resistor 120 and a first terminal of the capacitor 130. A second terminal of the resistor 120 may comprise a second terminal 180 of the one or more hybrid inductors 200. A third terminal of the transistor 110 may be coupled to a first terminal of an inductor 210, and a second terminal of the inductor 210 may be coupled to a second terminal of the capacitor 130 and may comprise a third terminal 160 of the one or more hybrid inductors 200. An impedance of the one or more hybrid inductors 200 may be configured by varying a transconductance of the transistor 110, a resistance of the resistor 120, and/or a capacitance of the capacitor 130. A constant voltage may be applied to the second terminal 180 of the one or more hybrid inductors 200. The transistor 110 may be biased during large signal operation by supplying current to the third terminal of the transistor 110 utilizing a current source 220. Signals may be amplified utilizing the one or more hybrid inductors as a load of one or more amplifiers 300, which may comprise differential amplifiers 310-1 and 310-2. The transistor 110 may comprise a MOSFET and the inductor 210 may comprise a passive inductor.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for processing signals, the method comprising:

in an electrical circuit, providing an electrical impedance that increases with frequency utilizing one or more hybrid inductors comprising a transistor coupled to a capacitor, an inductor, and a resistor, wherein:

a first terminal of said one or more hybrid inductors comprises a first terminal of said transistor;

a second terminal of said transistor is coupled to a first terminal of said resistor and a first terminal of said capacitor;

a second terminal of said resistor comprises a second terminal of said one or more hybrid inductors;

a third terminal of said transistor is coupled to a first terminal of an inductor; and a second terminal of said inductor is coupled to a second terminal of said capacitor and comprises a third terminal of said one or more hybrid inductors.

2. The method according to claim 1, comprising configuring an impedance of said one or more hybrid inductors by varying a transconductance of said transistor.

3. The method according to claim 1, comprising configuring an impedance of said one or more hybrid inductors by varying a resistance of said resistor.

4. The method according to claim 1, comprising configuring an impedance of said one or more hybrid inductors by varying a capacitance of said capacitor.

5. The method according to claim 1, comprising applying a constant voltage to said second terminal of said one or more hybrid inductors.

6. The method according to claim 1, comprising biasing said transistor during large signal operation by supplying current to said third terminal of said transistor utilizing a current source.

7. The method according to claim 1, comprising amplifying signals utilizing said one or more hybrid inductors as a load of one or more amplifiers.

8. The method according to claim 7, wherein said one or more amplifiers comprise differential amplifiers.

9. The method according to claim 1, wherein said transistor comprises a MOSFET.

10. The method according to claim 1, wherein said inductor comprises a passive inductor.

11. A system for processing signals, the system comprising:

one or more circuits that provides an electrical impedance that increases with frequency, wherein said one or more circuits comprises one or more hybrid inductors having a transistor coupled to a capacitor, an inductor, and a resistor, and wherein:

a first terminal of said one or more hybrid inductors comprises a first terminal of said transistor;

a second terminal of said transistor is coupled to a first terminal of said resistor and a first terminal of said capacitor;

a second terminal of said resistor comprises a second terminal of said one or more hybrid inductors;

a third terminal of said transistor is coupled to a first terminal of an inductor; and a second terminal of said inductor is coupled to a second terminal of said capacitor and comprises a third terminal of said one or more hybrid inductors.

12. The system according to claim 11, wherein said one or more circuits is operable to configure an impedance of said one or more hybrid inductors by varying a transconductance of said transistor.

13. The system according to claim 11, wherein said one or more circuits is operable to configure an impedance of said one or more hybrid inductors by varying a resistance of said resistor.

14. The system according to claim 11, wherein said one or more circuits is operable to configure an impedance of said one or more hybrid inductors by varying a capacitance of said capacitor.

15. The system according to claim 11, wherein said one or more circuits is operable to apply a constant voltage to said second terminal of said one or more hybrid inductors.

16. The system according to claim 11, wherein said one or more circuits is operable to apply a constant voltage to bias said transistor during large signal operation by supplying current to said third terminal of said transistor utilizing a current source.

17. The system according to claim 11, wherein said one or more circuits is operable to apply a constant voltage to amplifying signals utilizing said one or more hybrid inductors as a load of one or more amplifiers.

18. The system according to claim 17, wherein said one or more amplifiers comprise differential amplifiers.

19. The system according to claim 11, wherein said transistor comprises a MOSFET.

20. The system according to claim 11, wherein said inductor comprises a passive inductor.

21. A method for processing signals, the method comprising:
in an electrical circuit:
providing an electrical impedance that increases with frequency utilizing one or more hybrid inductors comprising a transistor coupled to a capacitor, an inductor, and a resistor; and
configuring an impedance of said one or more hybrid inductors by varying a resistance of said resistor 22. The method according to claim 21, comprising configuring an impedance of said one or more hybrid inductors by varying a capacitance of said capacitor.

23. The method according to claim 21, comprising applying a constant voltage to said second terminal of said one or more hybrid inductors.

24. The method according to claim 21, comprising amplifying signals utilizing said one or more hybrid inductors as a load of one or more amplifiers.

25. The method according to claim 24, wherein said one or more amplifiers comprise differential amplifiers.

26. The method according to claim 21, wherein said transistor comprises a MOSFET.

27. The method according to claim 21, wherein said inductor comprises a passive inductor.

28. A system for processing signals, the system comprising:
one or more circuits that provides an electrical impedance that increases with frequency, wherein:
said one or more circuits comprises one or more hybrid inductors having a transistor coupled to a capacitor, an inductor, and a resistor; and
said one or more circuits is operable to configure an impedance of said one or more hybrid inductors by varying a resistance of said resistor.

29. The system according to claim 28, wherein said one or more circuits is operable to configure an impedance of said one or more hybrid inductors by varying a capacitance of said capacitor.

30. The system according to claim 28, wherein said one or more circuits is operable to apply a constant voltage to said second terminal of said one or more hybrid inductors.

31. The system according to claim 28, wherein said one or more circuits is operable to apply a constant voltage to amplifying signals utilizing said one or more hybrid inductors as a load of one or more amplifiers.

32. The system according to claim 31, wherein said one or more amplifiers comprise differential amplifiers.

33. The system according to claim 28, wherein said transistor comprises a MOSFET.

34. The system according to claim 28, wherein said inductor comprises a passive inductor.

35. A method for processing signals, the method comprising:
in an electrical circuit:
providing an electrical impedance that increases with frequency utilizing one or more hybrid inductors comprising a transistor coupled to a capacitor, an inductor, and a resistor; and
configuring an impedance of said one or more hybrid inductors by varying a capacitance of said capacitor.

36. The method according to claim 35, comprising amplifying signals utilizing said one or more hybrid inductors as a load of one or more amplifiers.

37. The method according to claim 36, wherein said one or more amplifiers comprise differential amplifiers.

38. The method according to claim 35, wherein said transistor comprises a MOSFET.

39. The method according to claim 35, wherein said inductor comprises a passive inductor.

40. A system for processing signals, the system comprising:
one or more circuits that provides an electrical impedance that increases with frequency, wherein:
said one or more circuits comprises one or more hybrid inductors having a transistor coupled to a capacitor, an inductor, and a resistor; and
said one or more circuits is operable to configure an impedance of said one or more hybrid inductors by varying a capacitance of said capacitor.

41. The system according to claim 40, wherein said one or more circuits is operable to apply a constant voltage to amplifying signals utilizing said one or more hybrid inductors as a load of one or more amplifiers.

42. The system according to claim 41, wherein said one or more amplifiers comprise differential amplifiers.

43. The system according to claim 40, wherein said transistor comprises a MOSFET.

44. The system according to claim 40, wherein said inductor comprises a passive inductor.

45. A method for processing signals, the method comprising:
in an electrical circuit:
providing an electrical impedance that increases with frequency utilizing one or more hybrid inductors comprising a transistor coupled to a capacitor, an inductor, and a resistor; and
biasing said transistor during large signal operation by supplying current to said third terminal of said transistor utilizing a current source.

46. The method according to claim 45, comprising amplifying signals utilizing said one or more hybrid inductors as a load of one or more amplifiers.

47. The method according to claim 46, wherein said one or more amplifiers comprise differential amplifiers.

48. The method according to claim 45, wherein said transistor comprises a MOSFET.

49. The method according to claim 45, wherein said inductor comprises a passive inductor.

50. A system for processing signals, the system comprising:
   one or more circuits that provides an electrical impedance that increases with frequency, wherein:
      said one or more circuits comprises one or more hybrid inductors having a transistor coupled to a capacitor, an inductor, and a resistor; and
      said one or more circuits is operable to apply a constant voltage to bias said transistor during large signal operation by supplying current to said third terminal of said transistor utilizing a current source.

51. The system according to claim 50, wherein said one or more circuits is operable to apply a constant voltage to amplifying signals utilizing said one or more hybrid inductors as a load of one or more amplifiers.

52. The system according to claim 51, wherein said one or more amplifiers comprise differential amplifiers.

53. The system according to claim 50, wherein said transistor comprises a MOSFET.

54. The system according to claim 50, wherein said inductor comprises a passive inductor.

55. A method for processing signals, the method comprising:
   in an electrical circuit:
      providing an electrical impedance that increases with frequency utilizing one or more hybrid inductors comprising a transistor coupled to a capacitor, an inductor, and a resistor; and
      amplifying signals utilizing said one or more hybrid inductors as a load of one or more amplifiers.

56. The method according to claim 55, wherein said one or more amplifiers comprise differential amplifiers.

57. The method according to claim 55, wherein said transistor comprises a MOSFET.

58. The method according to claim 55, wherein said inductor comprises a passive inductor.

59. A system for processing signals, the system comprising:
   one or more circuits that provides an electrical impedance that increases with frequency, wherein:
      said one or more circuits comprises one or more hybrid inductors having a transistor coupled to a capacitor, an inductor, and a resistor; and
      said one or more circuits is operable to apply a constant voltage to amplifying signals utilizing said one or more hybrid inductors as a load of one or more amplifiers.

60. The system according to claim 59, wherein said one or more amplifiers comprise differential amplifiers.

61. The system according to claim 59, wherein said transistor comprises a MOSFET.

62. The system according to claim 61, wherein said inductor comprises a passive inductor.

* * * * *